US009484429B2

(12) United States Patent
Isobe et al.

(10) Patent No.: US 9,484,429 B2
(45) Date of Patent: Nov. 1, 2016

(54) HIGH ELECTRON MOBILITY TRANSISTOR (HEMT) CAPABLE OF ABSORBING A STORED HOLE MORE EFFICIENTLY AND METHOD FOR MANUFACTURING THE SAME

(71) Applicant: KABUSHIKI KAISHA TOSHIBA, Minato-ku (JP)

(72) Inventors: Yasuhiro Isobe, Ishikawa-ken (JP); Mayumi Morizuka, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/793,410

(22) Filed: Jul. 7, 2015

(65) Prior Publication Data

US 2015/0325680 A1    Nov. 12, 2015

Related U.S. Application Data

(62) Division of application No. 14/025,961, filed on Sep. 13, 2013, now Pat. No. 9,136,346.

(30) Foreign Application Priority Data

Oct. 31, 2012    (JP) ................................ 2012-240866

(51) Int. Cl.
*H01L 29/15*        (2006.01)
*H01L 31/0256*    (2006.01)
(Continued)

(52) U.S. Cl.
CPC ... *H01L 29/66462* (2013.01); *H01L 21/26546* (2013.01); *H01L 29/1029* (2013.01); *H01L 29/7783* (2013.01); *H01L 29/2003* (2013.01)

(58) Field of Classification Search
CPC .................... H01L 29/66462; H01L 29/1029; H01L 21/26546; H01L 29/7783; H01L 29/2003
See application file for complete search history.

(56) References Cited

U.S. PATENT DOCUMENTS 6,429,467 B1    8/2002    Ando ............................ 257/194
6,555,851 B2    4/2003    Morizuka
(Continued)

FOREIGN PATENT DOCUMENTS

JP    2000-223697 A    8/2000
JP    2001-284576         10/2001
(Continued)

OTHER PUBLICATIONS

Kriste et al., Structural Properties of MBE AlInN and AlGaInN Barrier Layers for GaN-HEMT Structures, 2010, Phys. Status Solidi A, vol. 201, No. 6, pp. 1338-1341.
(Continued)

*Primary Examiner* — Stephen W Smoot
*Assistant Examiner* — Vicki B Booker
(74) *Attorney, Agent, or Firm* — Oblon, McClelland, Maier & Neustadt, L.L.P

(57) ABSTRACT

A semiconductor device includes a first semiconductor layer, a second semiconductor layer, a third semiconductor layer, a first electrode, a second electrode, a control electrode, and a third electrode. The second semiconductor layer is provided on the first semiconductor layer and has a band gap narrower than that of the first semiconductor layer. The second semiconductor layer includes a first portion and a second portion which is provided together with the first portion and contains an activated acceptor. The third semiconductor layer is provided on the first portion and has a band gap wider than or equal to the band gap of the second semiconductor layer. The first and the second electrodes are provided on the third semiconductor layer. The control electrode is provided between the first electrode and the second electrode. The third electrode is provided on the second portion.

4 Claims, 14 Drawing Sheets

(51) Int. Cl.
*H01L 29/66* (2006.01)
*H01L 21/265* (2006.01)
*H01L 29/10* (2006.01)
*H01L 29/778* (2006.01)
*H01L 29/20* (2006.01)

(56) References Cited

U.S. PATENT DOCUMENTS

| | | | |
|---|---|---|---|
| 6,689,652 | B2 | 2/2004 | Morizuka |
| 6,908,799 | B2 | 6/2005 | Morizuka |
| 2007/0249119 | A1 | 10/2007 | Saito .......................... 438/253 |
| 2007/0278521 | A1 | 12/2007 | Ishida ......................... 257/192 |
| 2011/0241017 | A1 | 10/2011 | Ikeda et al. |
| 2012/0211760 | A1 | 8/2012 | Yamada ........................ 257/76 |

FOREIGN PATENT DOCUMENTS

| | | |
|---|---|---|
| JP | 2004-342810 | 12/2004 |
| JP | 2005-268493 A | 9/2005 |
| JP | 2007-294528 A | 11/2007 |
| JP | 2007-329205 A | 12/2007 |
| JP | 2008-16588 A | 1/2008 |
| JP | 2008-258419 A | 10/2008 |
| JP | 2010-109086 A | 5/2010 |
| JP | 2011-9493 A | 1/2011 |
| JP | 2012-119435 A | 6/2012 |
| JP | 2012-174714 A | 9/2012 |

OTHER PUBLICATIONS

Office Action issued Aug. 22, 2016, in Japanese Patent Application No. 2012-240866, filed Oct. 31, 2012 (w/English-language Translation).

HIGH ELECTRON MOBILITY TRANSISTOR (HEMT) CAPABLE OF ABSORBING A STORED HOLE MORE EFFICIENTLY AND METHOD FOR MANUFACTURING THE SAME

CROSS-REFERENCE TO RELATED APPLICATIONS

This application is a divisional of U.S. application Ser. No. 14/025,961 filed Sep. 13, 2013 (issued as U.S. Pat. No. 9,136,346), and is based upon and claims the benefit of priority from Japanese Patent Application No. 2012-240866, filed on Oct. 31, 2012; the entire contents of each of which are incorporated herein by reference.

FIELD

Embodiments described herein relate generally to a semiconductor device and a method for manufacturing the same.

BACKGROUND

A semiconductor device can achieve a high breakdown voltage and a low on-state resistance effectively by using a material that has a high critical electric field. For example, a high electron mobility transistor (HEMT) using a nitride semiconductor exhibits a high breakdown voltage and a low on-resistance by utilizing a two-dimensional electron gas (2DEG) generated at a heterojunction interface.

An electron-hole pair is formed by a phenomenon called impact ionization in which an accelerated electron excites an electron in a valence band, when a field effect transistor using a nitride semiconductor is operated under high voltage. The hole generated is stored in an electron channel layer and causes a kink effect in an electrical characteristic of the transistor. The stored hole further induces avalanche breakdown, thereby leading to a drop in the breakdown voltage. It is therefore desired that a semiconductor device has a structure capable of absorbing the stored hole more efficiently.

DETAILED DESCRIPTION

Figure 1:
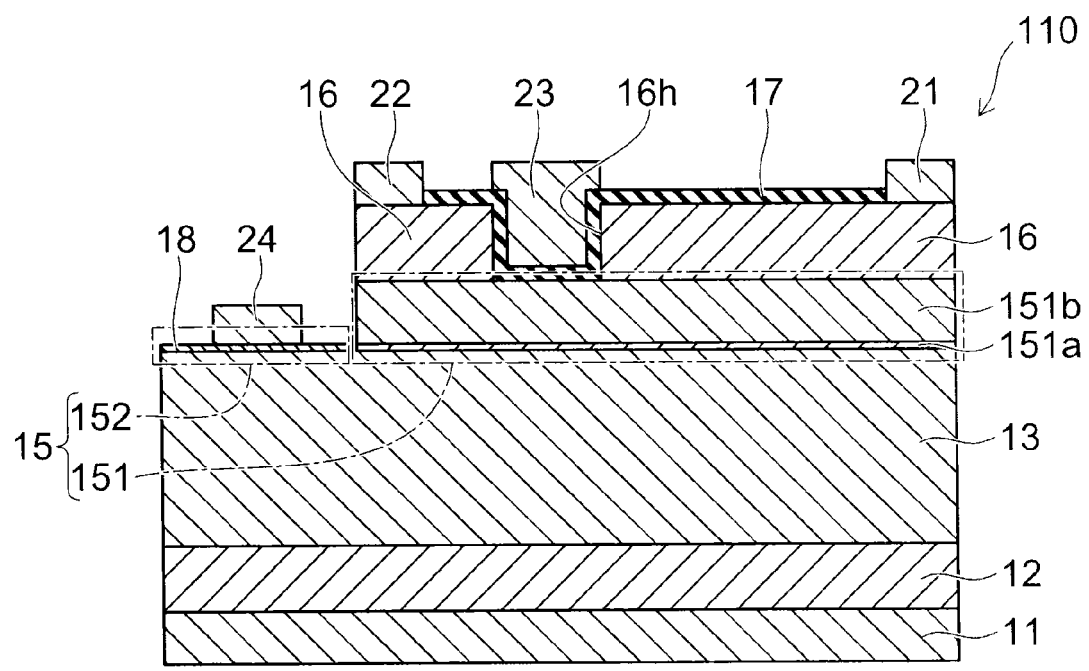
FIG. 1 is a schematic cross-section view illustrating the configuration of a semiconductor device according to a first embodiment.

In general, according to one embodiment, a semiconductor device includes a first semiconductor layer, a second semiconductor layer, a third semiconductor layer, a first electrode, a second electrode, a control electrode, and a third electrode. The second semiconductor layer is provided on the first semiconductor layer and has a band gap narrower than a band gap of the first semiconductor layer. The second semiconductor layer includes a first portion and a second portion which is provided together with the first portion and contains an activated acceptor. The third semiconductor layer is provided on the first portion and has a band gap wider than or equal to the band gap of the second semiconductor layer. The first electrode is provided on the third semiconductor layer. The second electrode is provided on the third semiconductor layer. The control electrode is provided between the first electrode and the second electrode. The third electrode is provided on the second portion.

Various embodiments will be described hereinafter with reference to the accompanying drawings. Note that in the following description, an identical reference numeral will be assigned to an identical member while description of a member described once will be omitted as appropriate the next time it appears herein.

First Embodiment

FIG. 1 is a schematic cross-sectional view illustrating the configuration of a semiconductor device according to a first embodiment.

As shown in FIG. 1, a semiconductor device 110 includes an electron barrier layer 13 (a first semiconductor layer), an electron channel layer 15 (a second semiconductor layer), an electron supply layer 16 (a third semiconductor layer), a drain electrode 21 (a first electrode), a source electrode 22 (a second electrode), a gate electrode 23 (a control electrode), and a hole absorption electrode 24 (a third electrode).

The semiconductor device 110 is an HEMT employing a nitride semiconductor, for example.

The semiconductor device 110 further includes a substrate 11 and a buffer layer 12. The substrate 11 can be a silicon substrate, a sapphire substrate, a silicon carbide substrate, a gallium nitride substrate, an aluminum nitride substrate, or a gallium oxide substrate, for example.

The buffer layer 12 is provided on the substrate 11 and serves to mitigate distortion generated by the disparity between a lattice constant of a nitride semiconductor layer formed on the buffer layer 12 and a lattice constant of the substrate 11. The thickness of the buffer layer 12 is not particularly limited. When the silicon substrate is used as the substrate 11, for example, the buffer layer 12 adopts a stacked structure in which AlN and GaN are alternately stacked into several tens of layers. It is desired that the buffer layer 12 is a layer that prevents a crack in an epitaxially grown layer formed on the buffer layer 12. The buffer layer 12 may possibly be unneeded depending on the substrate 11 used.

The electron barrier layer 13 is provided on the buffer layer 12. The electron barrier layer 13 is formed of non-doped $Al_wGa_{1-w-x}In_xN$ ($0<w\leq1$, $0\leq x<1$, $0\leq w+x\leq1$), for example.

The electron channel layer 15 is provided on the electron barrier layer 13. The electron channel layer 15 is formed of $Al_uGa_{1-u-v}In_vN$ ($0\leq u<1$, $0\leq v\leq1$, $0\leq u+v\leq1$), for example.

The electron supply layer 16 is provided on the electron channel layer 15. The electron supply layer 16 is formed of non-doped $Al_yGa_{1-y-z}In_zN$ ($0<y\leq1$, $0\leq z<1$, $0\leq y+z\leq1$), for example.

The electron barrier layer 13 serves to prevent an electron in the electron channel layer 15 from spreading toward the substrate 11 and has a band gap larger than that of the electron channel layer 15. The composition ratio of the electron barrier layer 13 falls within the range of $Al_uGa_{1-u}$ ($0<u<0.2$), for example. The thickness of the electron barrier layer 13 is 0.5 micrometers (μm) or more and 5 μm or less, preferably 0.8 μm or more and 4 μm or less, for example.

The electron channel layer 15 is thinner than the electron barrier layer 13. That is, the thickness of the electron channel layer 15 is 10 nanometers (nm) or more and 500 nm or less, for example. The electron channel layer 15 is formed such that the lattice thereof matches with a lattice of the electron barrier layer 13. For example, the lattice constant of the electron barrier layer 13 is inherited by the electron channel layer 15 when the electron channel layer 15 is formed to have the aforementioned thickness.

The electron supply layer 16 has a band gap larger than that of the electron channel layer 15. The thickness of the electron supply layer 16 is 5 nm or more and 50 nm or less, preferably 10 nm or more and 35 nm or less, for example. The electron supply layer 16 is formed such that the lattice thereof matches with the lattice of each of the electron barrier layer 13 and the electron channel layer 15. For example, the lattice constant of the electron barrier layer 13 and the electron channel layer 15 is inherited by the electron supply layer 16 when the electron supply layer 16 is formed to have the aforementioned thickness. The composition ratio of the electron supply layer 16 falls within the range of $Al_yGa_{1-y-z}In_zN$ ($0.1\leq y\leq1$ and $z=0$, or $0\leq z\leq0.3$ and $0.7\leq y\leq1$), for example.

The lattice constant of each of the electron barrier layer 13, the electron channel layer 15, and the electron supply layer 16 is measured by using an X-ray diffraction method, for example.

The electron channel layer 15 has a first portion 151 and a second portion 152. The first portion 151 and the second portion 152 are provided together with on the electron barrier layer 13. The second portion 152 is thinner than the first portion 151. The electron supply layer 16 is provided on the first portion 151 of the electron channel layer 15 but not on the second portion 152 thereof.

The thickness of the first portion 151 is 10 nm or more and 500 nm or less, for example. The thickness of the second portion 152 is several nm or more and several tens of nm or less, namely 3 nm or more and 10 nm or less, for example.

The first portion 151 has a first region 151a and a second region 151b. The first region 151a is provided on a side of the first portion 151 facing an interface between the electron barrier layer 13 and the first portion 151. The second region 151b is provided on a side of the first portion 151 facing the electron supply layer 16. This means that the first region 151a is provided between the electron barrier layer 13 and the second region 151b. The first region 151a contains an impurity, whereas the second region 151b does not substantially contain an impurity.

The second portion 152 is in contact with the first region 151a. The second portion 152 may be an extended portion of the first region 151a. The second portion 152 contains an impurity that is the same as the impurity contained in the first region 151a. The impurity contained in the second portion 152 is activated. The hole absorption electrode 24 is provided on the second portion 152.

The impurity contained in the first region 151a and the second portion 152 is a p-type impurity (an acceptor). It is desired that the first region 151a and the second portion 152 are formed by a doping method that does not affect the second region 151b of the electron channel layer 15 and the electron supply layer 16 by diffusion or segregation. Likewise, it is desired that the first region 151a has a doping concentration which does not affect the second region 151b and the electron supply layer 16.

The first region 151a and the second portion 152 are formed by delta doping while not using trimethyl gallium or the like that is a group III material. The delta doping here refers to a method in which a highly-concentrated impurity is implanted into an extremely thin region. For example, magnesium that is a p-type dopant is used in the delta doping. The concentration of the p-type dopant in the delta doping is $1\times10^{11}$ cm$^{-2}$ or more and $1\times10^{14}$ cm$^{-2}$ or less, preferably $1\times10^{12}$ cm$^{-2}$, for example.

The second portion 152 is activated to become a first p-type active region 18. The first p-type active region 18 is formed when the region (the second portion 152) exposed after removing a part of the electron supply layer 16 is activated.

An insulating film 17, the source electrode 22, and the drain electrode 21 are provided on the electron supply layer 16. The electron supply layer 16 further has a hole portion 16h (a recessed region). The hole portion 16h recedes from an upper surface of the electron supply layer 16 toward the electron channel layer 15. The insulating film 17 is provided on the upper surface of the electron supply layer 16 and an inner surface of the hole portion 16h. The gate electrode 23 is provided on the insulating film 17 disposed within the hole portion 16h.

In the semiconductor device 110, the electron density of a 2DEG formed on a hetero-interface side of the electron channel layer 15 fluctuates in accordance with voltage applied to the gate electrode 23, thereby controlling the electron movement. That is, the amount of current flowing between the source electrode 22 and the drain electrode 21 is controlled by the voltage applied to the gate electrode 23.

An electron-hole pair is formed in the electron channel layer 15 when high voltage is applied between the gate electrode 23 and the drain electrode 21 of the semiconductor device 110. A hole remaining in the electron channel layer 15 among the hole generated moves along the first region 151a of the electron channel layer 15 to the second portion 152 (the first p-type active region 18) and is discharged to the outside from the hole absorption electrode 24. As a result, a kink effect in an electrical characteristic caused by the storage of the hole can be suppressed in the semiconductor device 110. A drop in a breakdown voltage caused by the storage of the hole can also be suppressed in the semiconductor device 110.

A method for manufacturing the semiconductor device 110 will now be described.

FIG. 2A to FIG. 3D are a set of schematic cross-sectional views illustrating a method for manufacturing the semiconductor device.

The method for manufacturing the semiconductor device 110 is shown in FIG. 2A to FIG. 3D in the order that a process is performed.

Figure 2A:
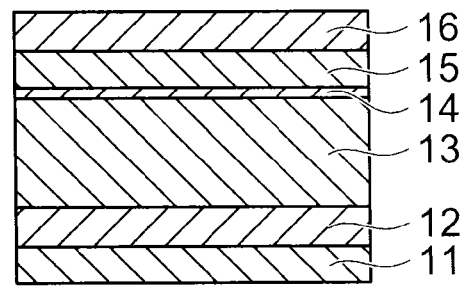
FIG. 2A to FIG. 3D are schematic cross-sectional views illustrating a method for manufacturing the semiconductor device.

First, as shown in FIG. 2A, the buffer layer 12 is formed on the substrate 11. The buffer layer 12 adopts the stacked structure in which AlN and GaN are alternately stacked into several tens of layers, for example.

The electron barrier layer 13, the electron channel layer 15 and the electron supply layer 16 are then stacked in order on the buffer layer 12. The first portion 151 containing the p-type impurity is formed on the side of the electron channel layer 15 facing the interface between the electron barrier layer 13 and the electron channel layer 15, when forming the electron channel layer 15. A known method such as metal organic chemical vapor deposition (MOCVD) or molecular beam epitaxy (MBE) is used in forming the nitride semiconductor layer configuring these layers.

Figure 2B:
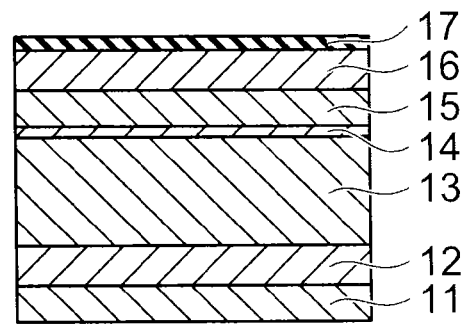

Next, as shown in FIG. 2B, the insulating film 17 is formed on the electron supply layer 16 that is epitaxially grown. The insulating film 17 is formed of $SiO_2$, $Si_3N_4$, $Al_2O_3$, for example. A known method such as chemical vapor deposition (CVD) is used in forming the insulating film 17.

Figure 2C:
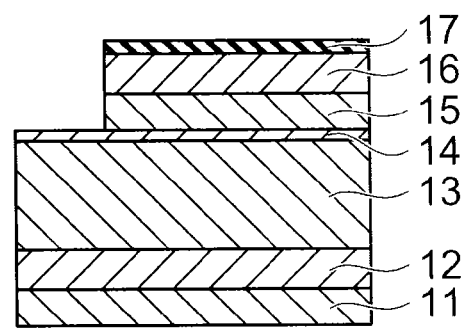

Then, as shown in FIG. 2C, a part of the insulating film 17, a part of the electron supply layer 16, and a part of the electron channel layer 15 are removed as first etching. The first etching is dry etching performed by using a reactive ion etching (RIE) apparatus that uses $Cl_2$ gas, for example. The second portion 152 of the electron channel layer 15 containing the p-type impurity is exposed as a result.

Figure 2D:
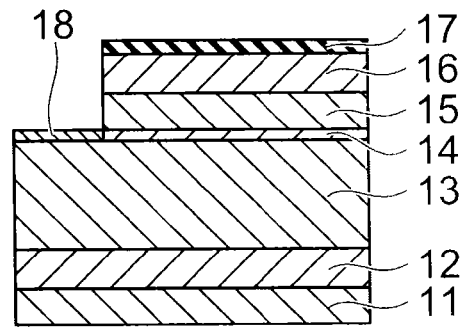

As shown in FIG. 2D, an annealing process is subsequently performed on the second portion 152 that is exposed, whereby the p-type impurity in the second portion 152 is activated. The second portion 152 turns into the first p-type active region 18 as a result of the activation. The annealing process is performed only for a short period of time by using a rapid thermal annealing apparatus, a flash-lamp heating apparatus, or the like. The p-type impurity contained in the first region 151a is not activated because the first region 151a of the first portion 151 is not exposed. The annealing process which forms the first p-type active region 18 is performed for the duration of less than a second to five minutes at a temperature of 500° C. or higher up to approximately 1000° C., for example.

Figure 3A:
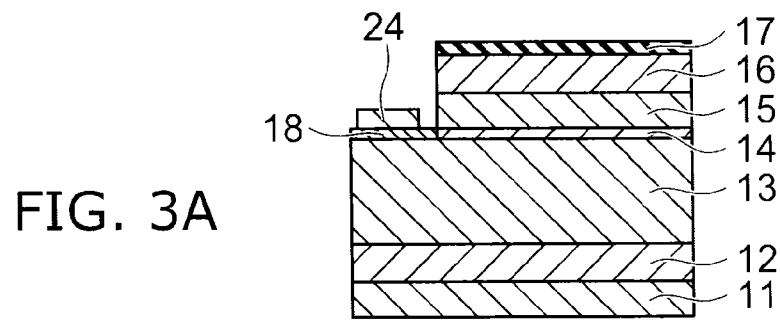

Then, as shown in FIG. 3A, the hole absorption electrode 24 is formed on the first p-type active region 18. The hole absorption electrode 24 is formed of a stacked metal such as Ni (bottom)/Au (top) that can establish an ohmic contact with the first p-type active region 18. The hole absorption electrode 24 may be formed of a stacked metal such as Pt (bottom)/Au (top) or a transparent oxide semiconductor (a transparent conductive film) such as ITO as long as the ohmic contact is established with the first p-type active region 18.

Figure 3B:
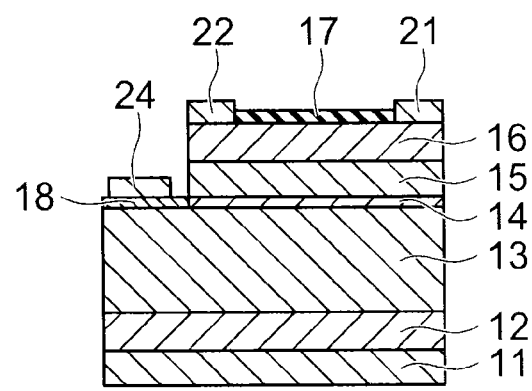

Next, as shown in FIG. 3B, a part of the insulating film 17 is removed as second etching in order to expose a portion of the electron supply layer 16 to be brought into contact with an ohmic electrode. The source electrode 22 and the drain electrode 21 are thereafter formed of a stacked metal such as Ti (bottom)/Al/Ni/Au (top) and establish the ohmic contact along with the hole absorption electrode 24 by the annealing process. The source electrode 22 and the drain electrode 21 may be formed of a stacked metal such as Ti (bottom)/Al (top) or Ti (bottom)/Al/Ti/Au (top) as long as the ohmic contact is satisfactorily established with the nitride semiconductor layer.

Figure 3C:
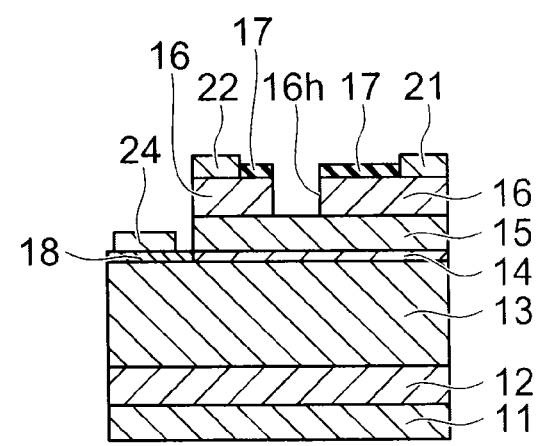
Figure 3D:
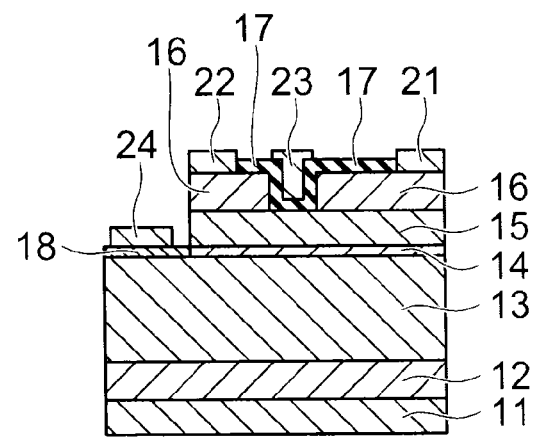

As shown in FIG. 3C, a part of the insulating film 17 and a part of the electron supply layer 16 between the source electrode 22 and the drain electrode 21 are removed as third etching. Subsequently, as shown in FIG. 3D, the insulating film 17 is re-formed in the hole portion 16h that is recessed down to the electron channel layer 15. The gate electrode 23 is formed thereafter. The gate electrode 23 is formed of a stacked metal such as Ni (bottom)/Au (top). The gate electrode 23 is formed of Pt (bottom)/Au (top) or TiN as needed. The insulating film 17 directly below the gate electrode 23 may be formed of a material different from a material forming the insulating film in the region on the electron supply layer 16 excluding the region directly below the gate electrode 23. Note that the hole absorption electrode 24 is formed on a side opposite to the drain electrode 23 with respect to the gate electrode 23 placed at a center of the two. The semiconductor device 110 is completed as a result.

Figure 4:
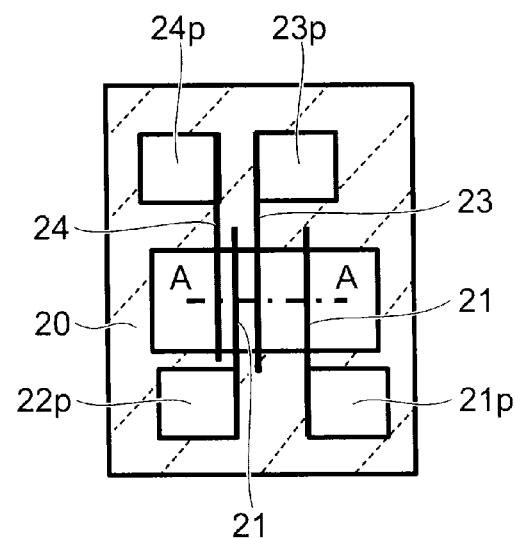
FIG. 4 is a schematic plan view of the semiconductor device.

FIG. 4 is a schematic plan view of a semiconductor device.

The schematic plan view of the semiconductor device 110 formed into a chip is shown in FIG. 4. A cross-sectional view taken along a line A-A of FIG. 4 corresponds to the schematic cross-sectional view shown in FIG. 1. Electrode pads 21p, 22p, 23p, and 24p are provided on a device isolation region 20. The electrode pad 21p is conductive with the drain electrode 21. The electrode pad 22p is conductive with the source electrode 22. The electrode pad 23p is conductive with the gate electrode 23. The electrode pad 24p is conductive with the hole absorption electrode 24.

The device isolation region 20 is required to have insulation with high resistance in order for a transistor of a designed size to operate without a current leaking from an intrinsic region. An ion such as N ion, B ion or Ar ion is implanted into the device isolation region 20. Note that the device isolation region 20 may be fabricated by removing the electron supply layer 16 and the electron channel layer 15. Although not shown, a process of forming the device isolation region 20 is incorporated into an appropriate stage in accordance with a device structure.

A semiconductor device according to a reference example will now be described.

Figure 18:
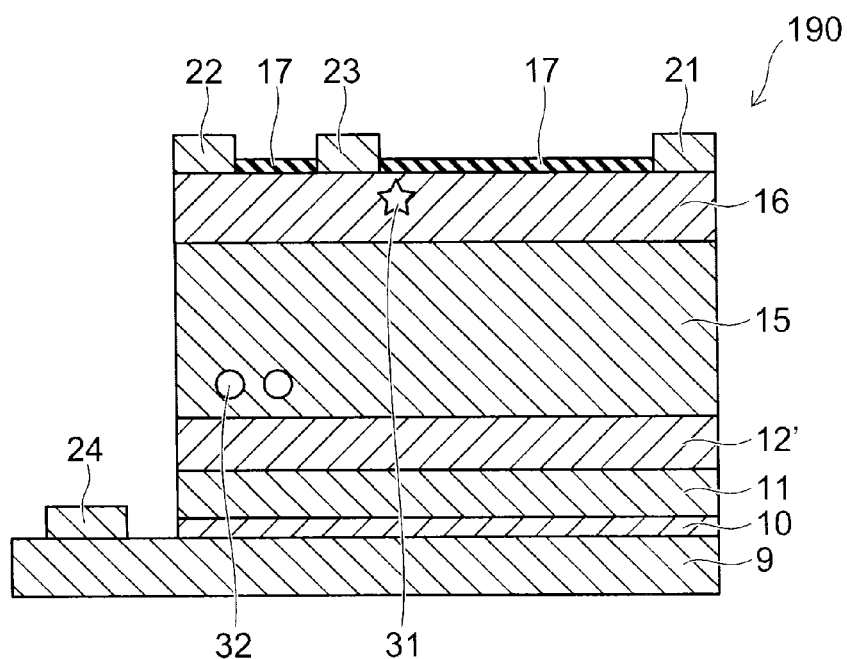
FIG. 18 is a schematic cross-sectional view illustrating a semiconductor according to a reference example.

FIG. 18 is a schematic cross-sectional view illustrating a semiconductor device according to the reference example.

As shown in FIG. 18, a semiconductor device 190 according to the reference example includes a substrate 11, a buffer layer 12', an electron channel layer 15, and an electron supply layer 16. The buffer layer 12' is provided on the substrate 11 that is conductive. The buffer layer 12' has p-type conductivity. A gate electrode 23 is provided on the electron supply layer 16, while a source electrode 22 and a drain electrode 21 are provided on both sides of the gate electrode 23. An insulating film 17 is formed in a region between the gate electrode 23 and the source electrode 22 and a region between the gate electrode 23 and the drain electrode 21 on the electron supply layer 16. Moreover, the substrate 11 is joined to a package 9 by a joint metal 10, while a hole absorption electrode 24 is formed on the package 9. The source electrode 22, the package 9, and the hole absorption electrode 24 are electrically connected and grounded.

In the semiconductor device 190, a hole 32 stored on a side of the electron channel layer 15 of an interface between the electron channel layer 15 and the buffer layer 12' need to move down through the conductive substrate 11 in order to flow to the hole absorption electrode 24. Generally speaking, the substrate 11 is remarkably thick compared to the electron channel layer 15 and the buffer layer 12' having p-type conductivity. As a result, an electrical potential barrier is created due to a band discontinuity between the buffer layer 12' having the p-type conductivity and the substrate 11 that have different band gaps, whereby the hole cannot be removed efficiently because of the increased resistance. It is also concerned that, due to the buffer layer 12' having the p-type conductivity, the diffusion and segregation of an impurity to the electron channel layer 15 causes an electrical characteristic to deteriorate.

Figure 5:
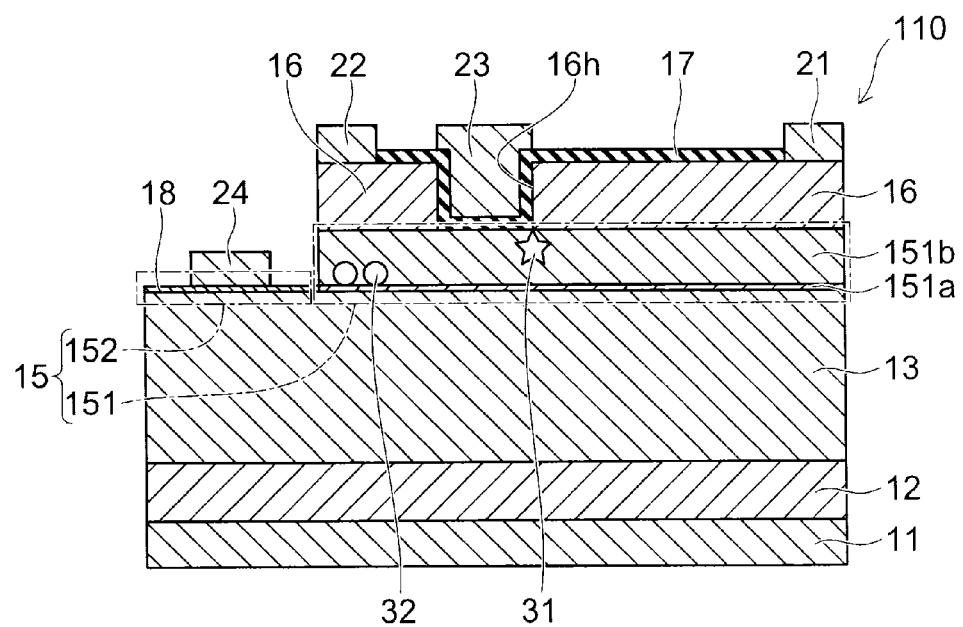
FIG. 5 is a schematic view illustrating a flow of a hole in the semiconductor device according to the first embodiment.

FIG. 5 is a schematic view illustrating a flow of the hole in the semiconductor device according to the first embodiment.

An electron-hole pair 31 generated by impact ionization exerts a noticeable influence when the electron channel layer 15 is sufficiently thinner than the electron barrier layer 13 as in the semiconductor device 110 shown in FIG. 5 and when the hole absorption electrode 24 is not present.

Figure 6A:
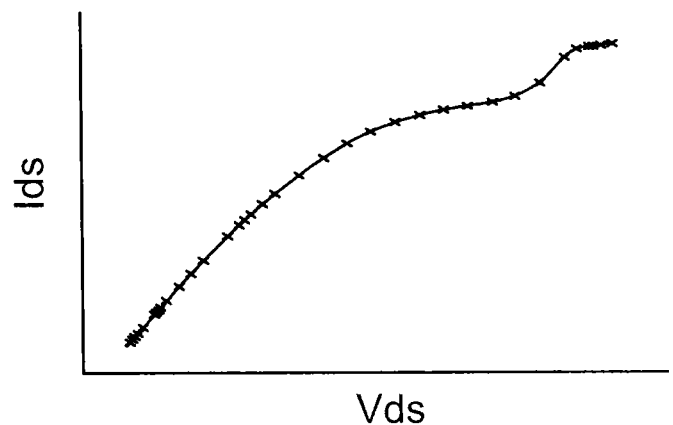
FIG. 6A and FIG. 6B are graphs illustrating a current-voltage characteristic of the semiconductor device.
Figure 6B:
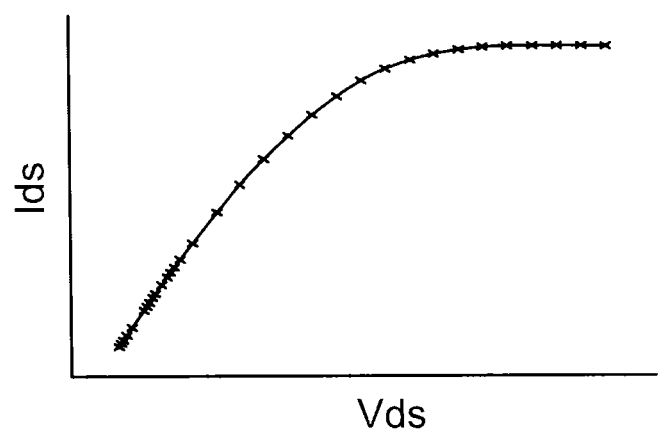

FIG. 6A and FIG. 6B are graphs illustrating a current-voltage characteristic of the semiconductor device.

FIG. 6A shows the characteristic that is influenced by the hole, whereas FIG. 6B shows the characteristic where the influence of the hole is suppressed. In each of FIG. 6A and FIG. 6B, a vertical axis represents a source-drain current while a horizontal axis represents a source-drain voltage.

A region where the hole 32 is stored in the semiconductor device 110 is positioned spatially close to the 2DEG formed in the interface between the electron supply layer 16 and the electron channel layer 15 in consequence of spontaneous polarization and a piezoelectric field. The potential of an electron is modulated when high voltage is applied to the gate electrode 23 and the drain electrode 21 while the hole is stored without being discharged. This causes the resistance between the source electrode 22 and the gate electrode 23 to decrease. Accordingly, as shown in FIG. 6A, a kink effect appears in the current-voltage characteristic.

On the other hand, the hole 32 stored in the electron channel layer 15 is discharged to the outside from the hole absorption electrode 24 when the hole absorption electrode 24 is present as in the semiconductor device 110. The influence of the hole is thus suppressed so that the kink effect in the current-voltage characteristic is suppressed, as shown in FIG. 6B. The semiconductor device 110 can achieve stable device operation as a result.

The semiconductor device 110 does not have the structure provided in the semiconductor device 190 according to the reference example where the hole generated by the impact ionization traverses a hetero-interface between the substrate 11 and the buffer layer 12' having the p-type conductivity. In the semiconductor device 110, the hole travels through the electron channel layer 15 only. As a result, the resistance for the movement of the hole is kept small so that the hole is discharged more effectively.

Furthermore, an acceptor impurity need not to be doped with thickness and high concentration in forming the buffer layer 12' in the manufacturing process, whereby contamination due to the diffusion and segregation of the impurity as well as a memory effect of the impurity in a film forming apparatus can be suppressed to the minimum. The adverse influence on a device characteristic can therefore be suppressed to the minimum. In addition, the avalanche breakdown can be suppressed by efficiently absorbing the stored hole 32, thereby suppressing a drop in the breakdown voltage.

Moreover, a threshold voltage can be shifted in a positive direction to have a higher value in the semiconductor device 110 where the electron channel layer 15 is sufficiently thinner than the electron barrier layer 13. That is, a difference in spontaneous polarization generated in the electron barrier layer and the electron channel layer 15 as well as piezo polarization caused by the lattice distortion in the electron channel layer 15 give rise to a positive charge in the interface between the electron barrier layer 13 and the electron channel layer 15 of the semiconductor device 110. The concentration of the 2DEG formed in the interface between the electron supply layer 16 and the electron channel layer 15 can be decreased when the electron channel layer 15 is sufficiently thinner than the electron barrier layer 13. The threshold voltage can therefore be shifted in the positive direction to have a higher value with the same gate structure.

The aforementioned structure of the semiconductor device 110 is also effective in suppressing a short channel effect in a structure where a gate length is shortened in order to achieve high-frequency operation.

Second Embodiment

Figure 7:
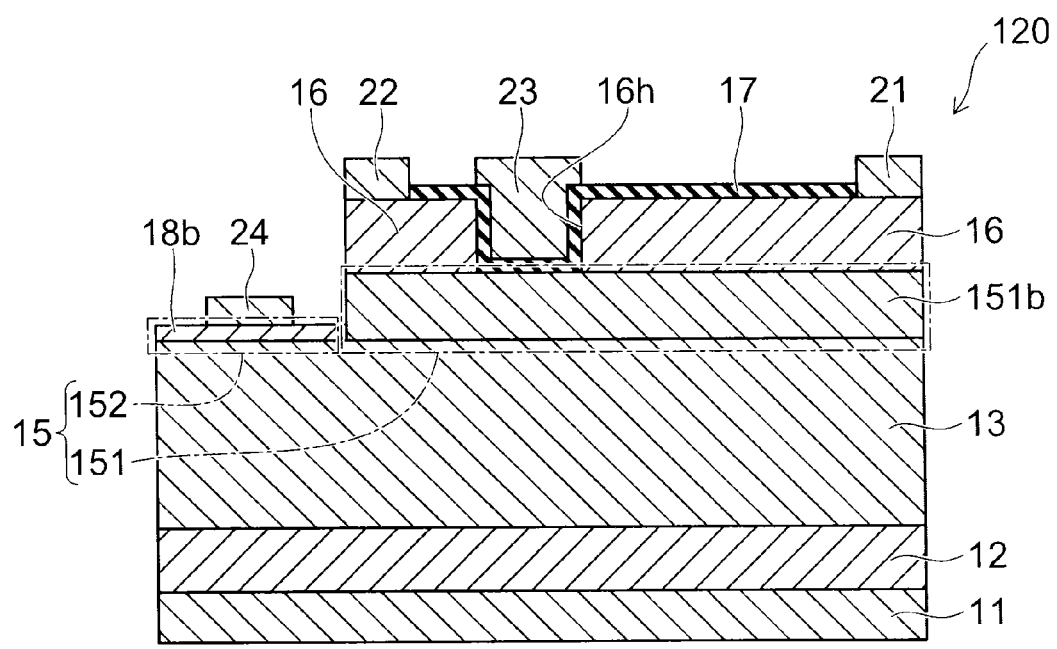
FIG. 7 is a schematic cross-sectional view illustrating the configuration of a semiconductor device according to a second embodiment.

FIG. 7 is a schematic cross-sectional view illustrating the configuration of a semiconductor device according to a second embodiment.

As shown in FIG. 7, a semiconductor device 120 according to the second embodiment is different from the semiconductor device 110 according to the first embodiment in that the semiconductor device 120 does not include the first region 151a. A second p-type active region 18b of the semiconductor device 120 is formed by subjecting a second portion 152 to plasma treatment using a fluorine-based gas.

An impurity is not introduced in forming an electron channel layer 15 of the semiconductor device 120. In the semiconductor device 120, a part of the electron channel layer 15 is removed by first etching, followed by subjecting the second portion 152 that has been exposed to the plasma treatment using the fluorine-based gas. The second p-type active region 18b is formed in the second portion 152 as a result.

A hole stored in the electron channel layer 15 of the semiconductor device 120 moves from a side of the electron channel layer 15 facing the electron barrier layer 13 to the second portion 152 (the second p-type active region 18b) and is discharged to the outside from a hole absorption electrode 24. As a result, a kink effect in an electrical characteristic caused by the storage of the hole can be suppressed in the semiconductor device 120. A drop in a breakdown voltage caused by the storage of the hole can also be suppressed in the semiconductor device 120.

A method for manufacturing the semiconductor device 120 will now be described.

FIG. 8A to FIG. 9D are a set of schematic cross-sectional views illustrating the method for manufacturing the semiconductor device.

The method for manufacturing the semiconductor device 120 is shown in FIG. 8A to FIG. 9D in the order that a process is performed.

Figure 8A:
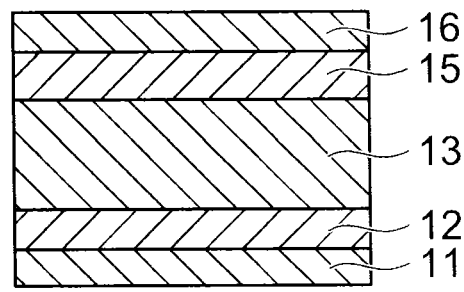
FIG. 8A to FIG. 9D are schematic cross-sectional views illustrating a method for manufacturing the semiconductor device.
Figure 8B:
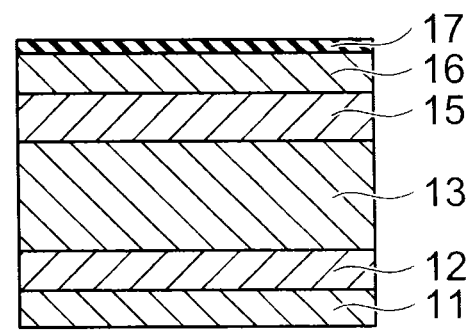

First, as shown in FIG. 8A and FIG. 8B, a buffer layer 12, the electron barrier layer 13, the electron channel layer 15, an electron supply layer 16, and an insulating film 17 are formed on a substrate 11. These layers and the film are formed in a manner similar to the method for manufacturing the semiconductor device 110. No impurity is substantially implanted in the formation of the electron channel layer 15, however.

Figure 8C:
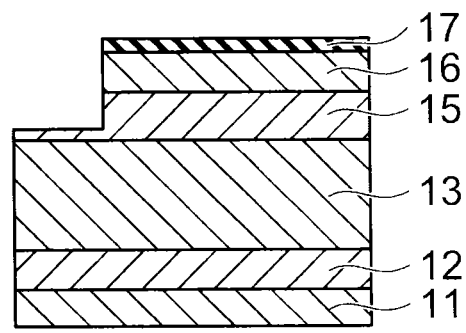

Then, as shown in FIG. 8C, a part of the insulating film 17, a part of the electron supply layer 16, and a part of the electron channel layer 15 are removed as first etching. The first etching is dry etching performed by using an RIE apparatus that uses $Cl_2$ gas, for example. The second portion 152 of the electron channel layer 15 is exposed as a result.

Figure 8D:
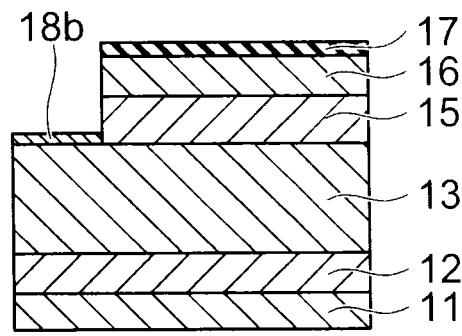

Next, as shown in FIG. 8D, the exposed second portion 152 is subjected to the plasma treatment by using the fluorine-based gas. The second portion 152 turns into the second p-type active region 18b as a result of the plasma treatment. The plasma treatment uses a gas containing $SF_6$, for example. The plasma treatment employs an inductive coupled plasma-RIE (ICP-RIE) apparatus with bias power of 10 watts (W) or more and 60 W or less, for example.

Figure 9A:
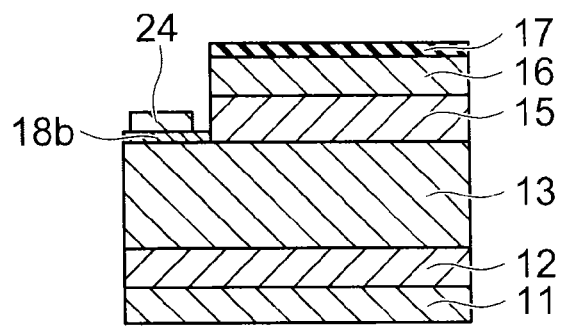
Figure 9B:
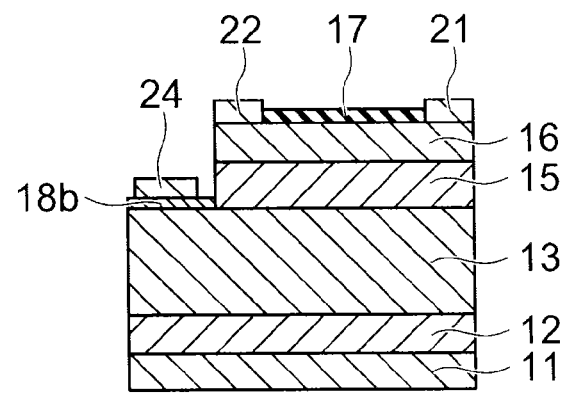
Figure 9C:
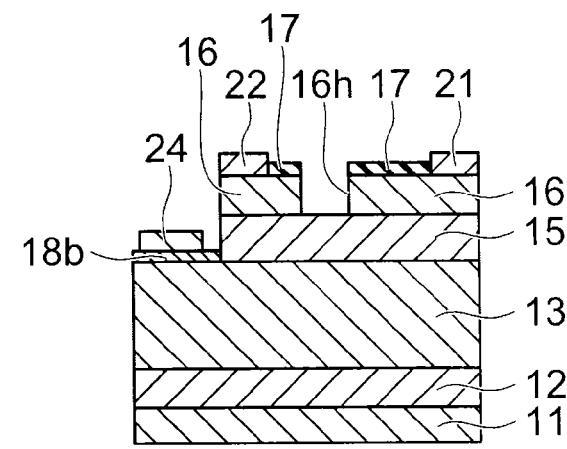
Figure 9D:
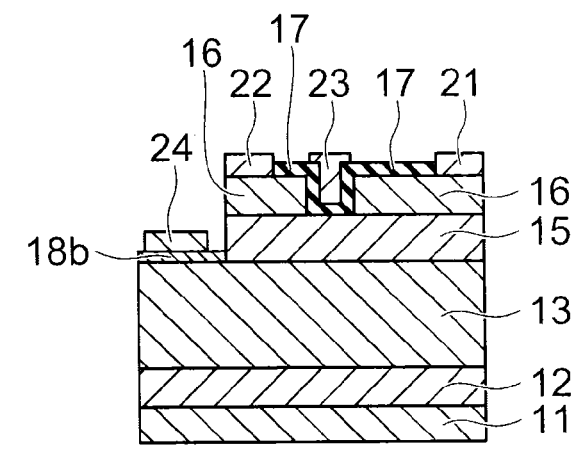

As shown in FIG. 9A, the hole absorption electrode 24 is then formed on the second p-type active region 18b so as to establish an ohmic contact therewith. A process shown in FIG. 9B to FIG. 9D that is a process on and after second etching is the same as the method for manufacturing the semiconductor device 110 according to the first embodiment. The semiconductor device 120 is completed as a result.

Third Embodiment

Figure 10:
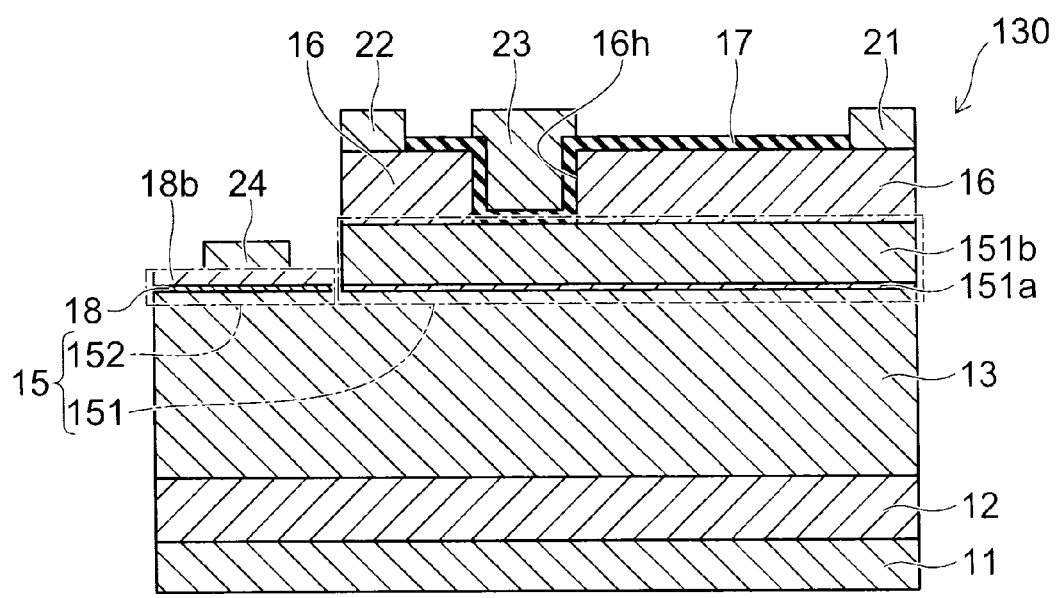
FIG. 10 is a schematic cross-sectional view illustrating the configuration of a semiconductor according to a third embodiment.

FIG. 10 is a schematic cross-sectional view illustrating the configuration of a semiconductor device according to a third embodiment.

As shown in FIG. 10, a semiconductor device 130 according to the third embodiment includes the first region 151a and the first p-type active region 18 of the semiconductor device 110 according to the first embodiment as well as the second p-type active region 18b of the semiconductor device 120 according to the second embodiment.

Similar to the semiconductor devices 110 and 120, a kink effect in an electrical characteristic as well as a drop in a breakdown voltage caused by the storage of a hole are suppressed in the semiconductor device 130. The second p-type active region 18b present in the semiconductor device 130 further allows a hole absorption electrode 24 to be in ohmic contact with the first p-type active region 18 and the second p-type active region 18b securely with a low resistance.

A method for manufacturing the semiconductor device 130 will now be described.

FIG. 11A to FIG. 12D are a set of schematic cross-sectional views illustrating the method for manufacturing the semiconductor device.

The method for manufacturing the semiconductor device 130 is shown in FIG. 11A to FIG. 12D in the order that a process is performed.

Figure 11A:
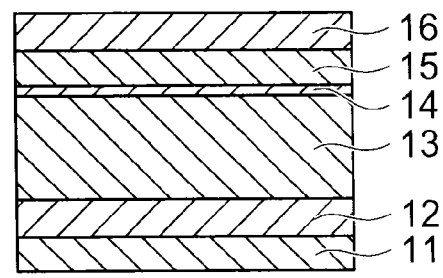
FIG. 11A to FIG. 12D are schematic cross-sectional views illustrating a method for manufacturing the semiconductor device.
Figure 11B:
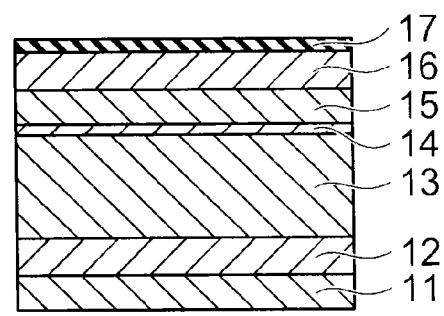

First, as shown in FIG. 11A and FIG. 11B, a buffer layer 12, an electron barrier layer 13, an electron channel layer 15, an electron supply layer 16, and an insulating film 17 are formed on a substrate 11. These layers and the film are formed in a manner similar to the method for manufacturing the semiconductor device 110.

Figure 11C:
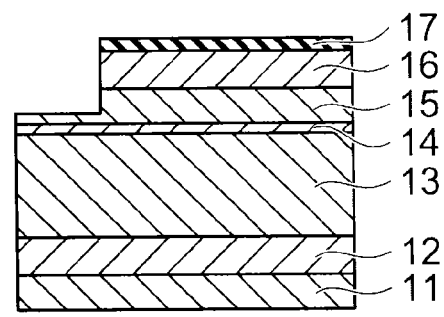

Next, as shown in FIG. 11C, a part of the insulating film 17, a part of the electron supply layer 16, and a part of the electron channel layer 15 are removed as first etching. The first etching is dry etching performed by using an RIE apparatus that uses $Cl_2$ gas, for example. It is desired that the layers and the film are etched to the depth not reaching the electron barrier layer 13 but as close to a layer of a second portion 152 extending from the first region 151a as possible.

Figure 11D:
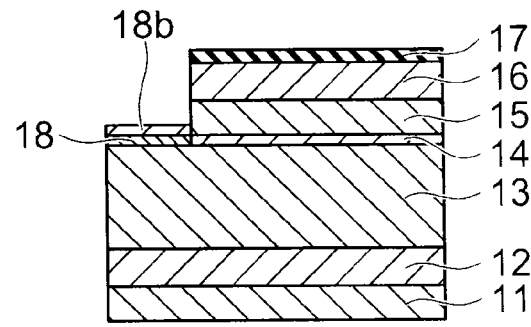

As shown in FIG. 11D, an annealing process is subsequently performed on the second portion 152 that is exposed, whereby a p-type impurity is activated in the layer of the second portion 152 extending from the first region 151a. The first p-type active region 18 is formed in the second portion 152 as a result of the activation. The annealing process is performed only for a short period of time by using a rapid thermal annealing apparatus, a flash-lamp heating apparatus, or the like. A p-type impurity contained in the first region 151a is not activated because the first region 151a of a first portion 151 is not exposed. The annealing process which forms the first p-type active region 18 is performed for the duration of less than a second to five minutes at a temperature of 500° C. or higher up to approximately 1000° C., for example.

Subsequently, the exposed second portion 152 is subjected to plasma treatment using a fluorine-based gas. The second p-type active region 18b (an acceptor region) is formed on the upper side of the first p-type active region 18 of the second portion 152 as a result of the plasma treatment. The plasma treatment uses a gas including $SF_6$, for example. The plasma treatment employs an ICP-RIE apparatus with bias power of 10 watts (W) or more and 60 W or less, for example.

Figure 12A:
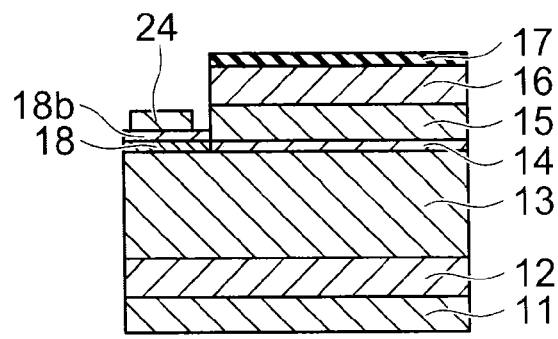
Figure 12B:
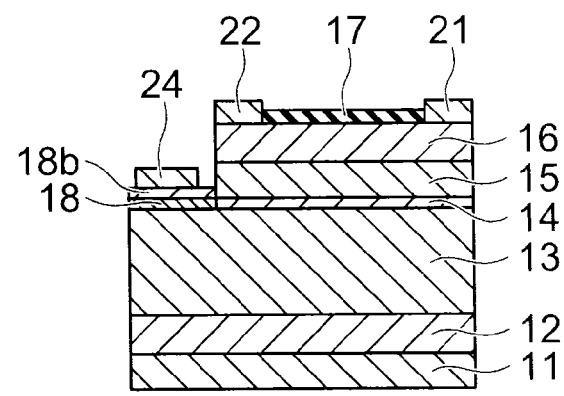
Figure 12C:
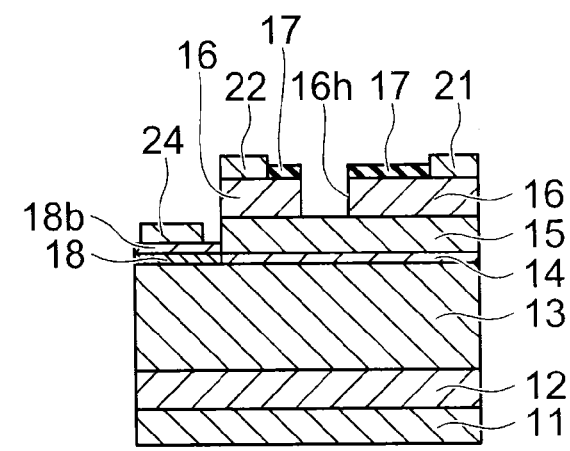
Figure 12D:
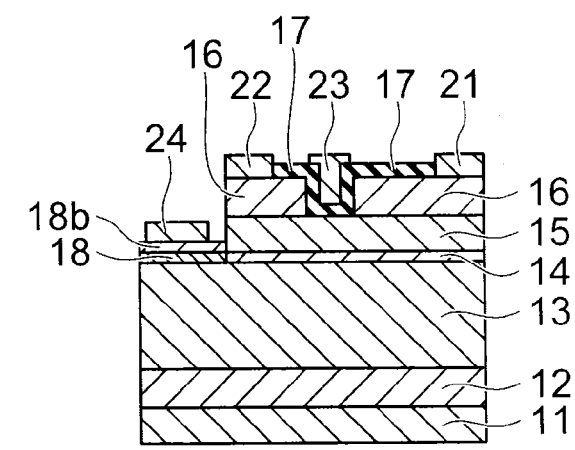

As shown in FIG. 12A, the hole absorption electrode 24 is then formed on the second p-type active region 18b so as to establish an ohmic contact therewith. A process shown in FIG. 12B to FIG. 12D that is a process on and after second etching is the same as the method for manufacturing the semiconductor device 110 according to the first embodiment. The semiconductor device 130 is completed as a result.

Fourth Embodiment

Figure 13:
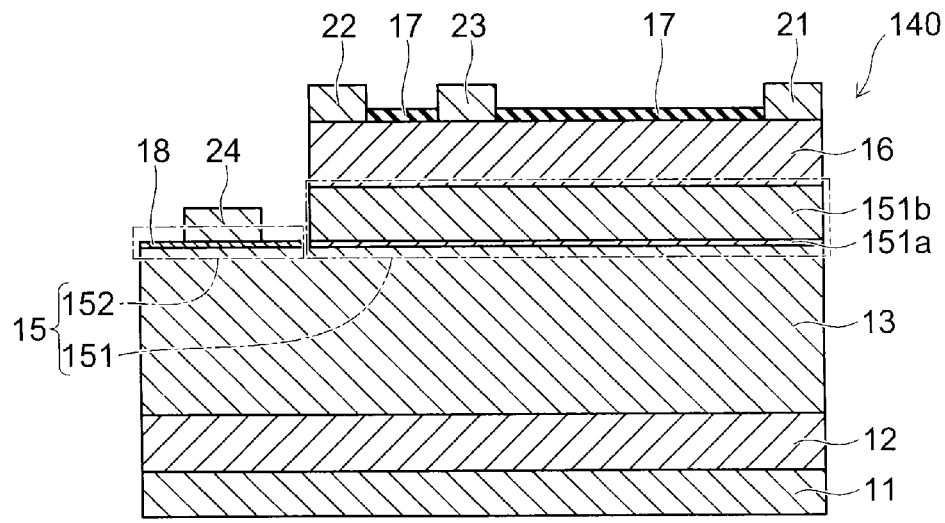
FIG. 13 is a schematic cross-sectional view illustrating the configuration of a semiconductor device according to a fourth embodiment.

FIG. 13 is a schematic cross-sectional view illustrating the configuration of a semiconductor device according to a fourth embodiment.

As shown in FIG. 13, a structure of a gate electrode in a semiconductor device 140 according to the fourth embodiment differs from the structure of the gate electrode in the semiconductor device 110 according to the first embodiment. That is, a gate electrode 23 of the semiconductor device 140 is in contact with an electron supply layer 16. An insulating film 17 is not provided between the gate electrode 23 and the electron supply layer 16. The rest of the configuration in the semiconductor device 140 is similar to that of the semiconductor device 110.

Similar to the semiconductor device 110, a kink effect in an electrical characteristic as well as a drop in a breakdown voltage caused by the storage of a hole are suppressed in the semiconductor device 140. The gate electrode 23 is formed easily in the semiconductor device 140 since a hole portion 16h need not to be formed in the electron supply layer 16.

Fifth Embodiment

Figure 14:
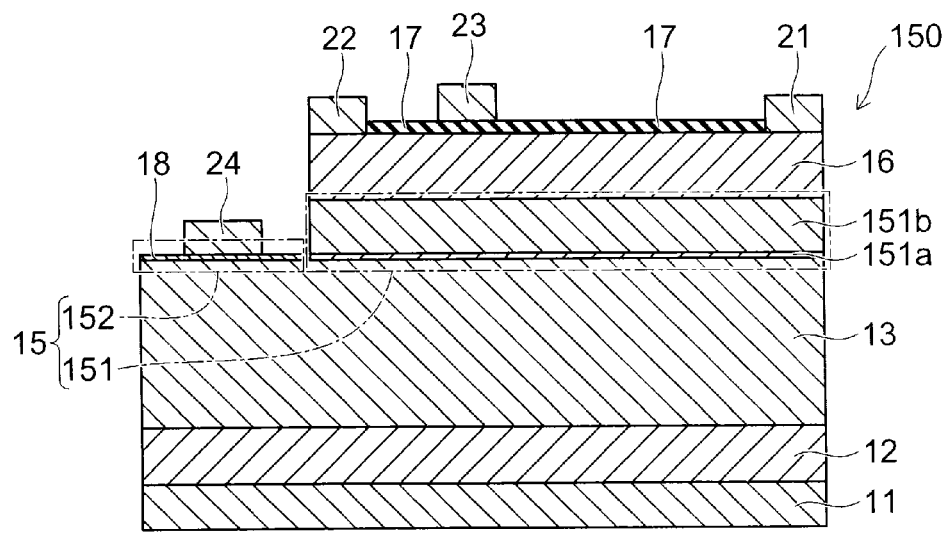
FIG. 14 is a schematic cross-sectional view illustrating the configuration of a semiconductor device according to a fifth embodiment.

FIG. 14 is a schematic cross-sectional view illustrating the configuration of a semiconductor device according to a fifth embodiment.

As shown in FIG. 14, a structure of a gate electrode in a semiconductor device 150 according to the fifth embodiment differs from the structure of the gate electrode in the semiconductor device 110 according to the first embodiment. That is, a hole portion 16h is not provided in an electron supply layer 16 of the semiconductor device 150. A gate electrode 23 in the semiconductor device 150 is provided on an upper surface of the electron supply layer 16 through an insulating film 17. The rest of the configuration in the semiconductor device 150 is similar to that of the semiconductor device 110.

Similar to the semiconductor device 110, a kink effect in an electrical characteristic as well as a drop in a breakdown voltage caused by the storage of a hole are suppressed in the semiconductor device 150. The semiconductor device 150 can also apply a more simple process of forming the gate electrode since a process of forming a hole in the electron supply layer 16 and the insulating film 17 is not required.

Sixth Embodiment

Figure 15:
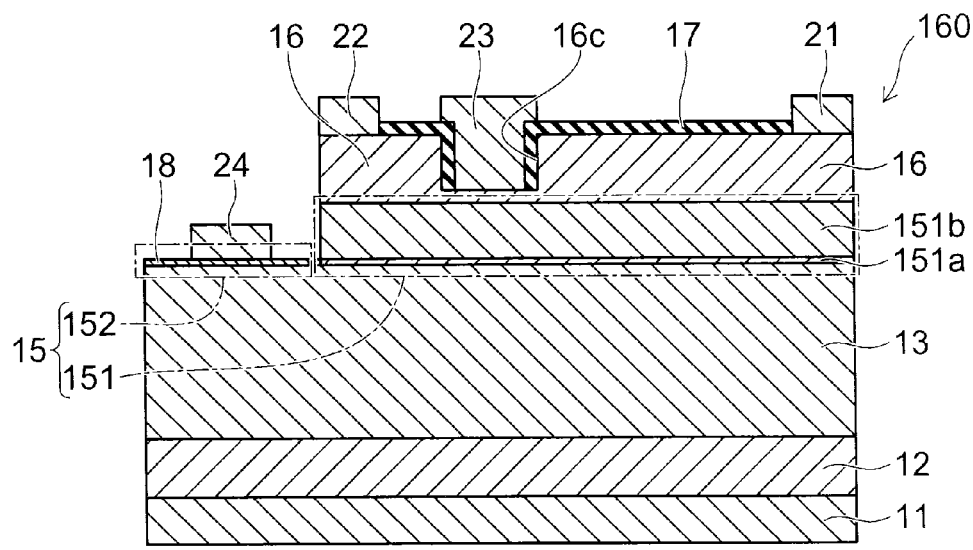
FIG. 15 is a schematic cross-sectional view illustrating the configuration of a semiconductor device according to a sixth embodiment.

FIG. 15 is a schematic cross-sectional view illustrating the configuration of a semiconductor device according to a sixth embodiment.

As shown in FIG. 15, a structure of a gate electrode in a semiconductor device 160 according to the sixth embodiment differs from the structure of the gate electrode in the semiconductor device 110 according to the first embodiment. That is, a concave portion 16c in the semiconductor device 160 is shallower than the hole portion 16h in the semiconductor device 110. A portion of the electron supply layer 16 corresponding to where the concave portion 16c is provided is thinned. A gate electrode 23 is in contact with the electron supply layer 16 at a bottom surface of the concave portion 16c. The rest of the configuration in the semiconductor device 160 is similar to that of the semiconductor device 110.

Similar to the semiconductor device 110, a kink effect in an electrical characteristic as well as a drop in a breakdown voltage caused by the storage of a hole are suppressed in the semiconductor device 160. The semiconductor device 160 can also achieve a desired threshold voltage by adjusting the depth of the concave portion 16c.

Seventh Embodiment

Figure 16:
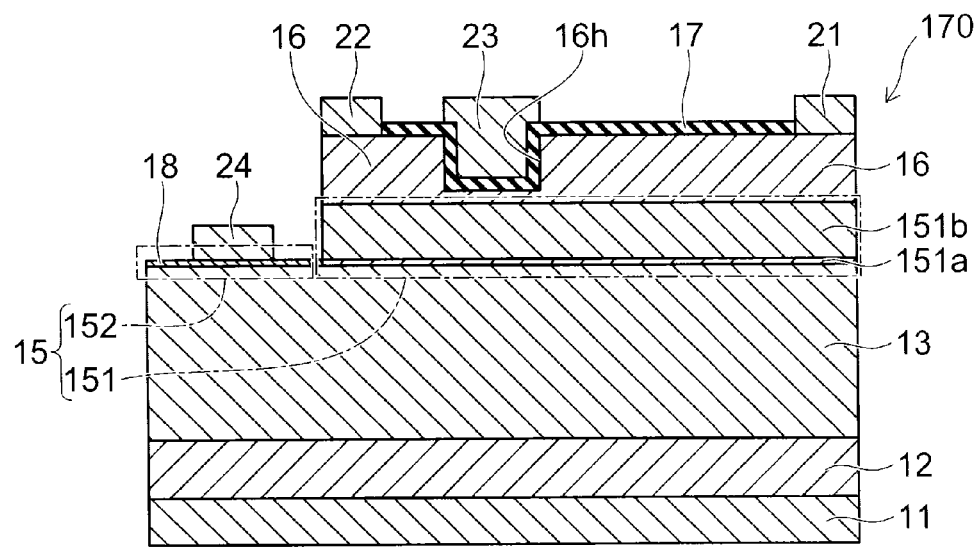
FIG. 16 is a schematic cross-sectional view illustrating the configuration of a semiconductor device according to a seventh embodiment.

FIG. 16 is a schematic cross-sectional view illustrating the configuration of a semiconductor device according to a seventh embodiment.

As shown in FIG. 16, a structure of a gate electrode in a semiconductor device 170 according to the seventh embodiment differs from the structure of the gate electrode in the semiconductor device 160 according to the sixth embodiment. That is, a gate electrode 23 in the semiconductor device 170 is provided in a concave portion 16c through an insulating film 17 provided at a bottom surface of the concave portion.

An electron supply layer 16 may adopt a multilevel structure in which $Al_yGa_{1-y-z}In_zN$ ($0<y\leq1$, $0\leq z<1$, $0\leq y+z\leq1$) having different compositions and film thicknesses are combined in forming the concave portion 16c in the electron supply layer 16. The rest of the configuration in the semiconductor device 170 is similar to that of the semiconductor device 160.

Similar to the semiconductor device 160, a kink effect in an electrical characteristic as well as a drop in a breakdown voltage caused by the storage of a hole are suppressed in the semiconductor device 170. The semiconductor device 170 can also be adapted to a larger current by forming the insulating film 17 below the gate electrode 23 so that a gate voltage can take a large positive value.

Eighth Embodiment

Figure 17:
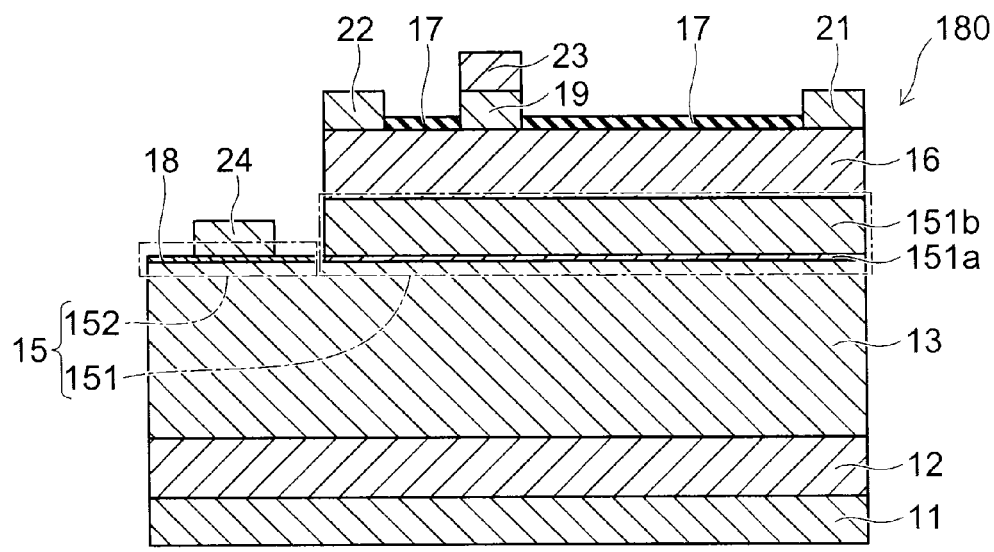
FIG. 17 is a schematic cross-sectional view illustrating the configuration of a semiconductor device according to an eighth embodiment.

FIG. 17 is a schematic cross-sectional view illustrating the configuration of a semiconductor device according to an eighth embodiment.

As shown in FIG. 17, a structure of a gate electrode in a semiconductor device 180 according to the eighth embodiment differs from the structure of the gate electrode in the semiconductor device 140 according to the fourth embodiment. That is, a gate electrode 23 in the semiconductor device 180 is formed on a p-type conductivity layer 19. The p-type conductivity layer 19 is provided between the gate electrode 23 and an electron supply layer 16 and is in contact with the electron supply layer 16. The p-type conductivity layer 19 is also in contact with the gate electrode 23. The rest of the configuration in the semiconductor device 180 is similar to that of the semiconductor device 140.

Similar to the semiconductor device 140, a kink effect in an electrical characteristic as well as a drop in a breakdown voltage caused by the storage of a hole are suppressed in the semiconductor device 180. Moreover, the electron supply layer 16 in the semiconductor device 180 can have a higher surface potential than that of the semiconductor devices 110, 120, 130, 140, 150, 160, and 170, thereby allowing a threshold voltage to take a positive value.

The gate structure in the aforementioned semiconductor devices 110, 120, 130, 140, 150, 160, 170, and 180 is not particularly limited. While the nitride semiconductor is used in the electron channel layer 15 and the electron supply layer 16 in the aforementioned semiconductor devices 110, 120, 130, 140, 150, 160, 170, and 180, another semiconductor such as GaAs, InP, or SiGe may be used instead. The band gap of GaN is wider than a band gap of each of Si and GaAs. As a result, the stable operation under high temperature, a low on-state resistance, and a high breakdown voltage can be achieved by using GaN as compared to when Si or GaAs is used.

The electrical characteristic can be stabilized in the semiconductor device according to the embodiments described above.

The embodiments have been described above while referring to specific examples; however, the embodiments are not to be limited to these specific examples. That is, modifications in design added appropriately to these specific examples by those skilled in the art are to be included in the scope of the embodiments as long as they include the characteristic of the embodiments. Each element and an arrangement, a material, a condition, a shape, a size and the like of the element included in each of the aforementioned specific examples can be modified as appropriate without being limited to what has been illustrated.

Moreover, the "nitride semiconductor" in the specification includes semiconductors with all compositions where a composition ratio of a chemical formula $B_\alpha In_\beta Al_\gamma Ga_{1-\alpha-\beta-\gamma}N$ ($0\leq\alpha\leq1$, $0\leq\beta\leq1$, $0\leq\gamma\leq1$, $\alpha+\beta+\gamma\leq1$) is varied within the range of each of $\alpha$, $\beta$, and $\gamma$. Furthermore, the "nitride semiconductor" includes a semiconductor which further includes, in the aforementioned chemical formula, a group V element other than N (nitrogen), various elements added in order to control various physical properties such as a conductivity type, and various elements added unintentionally.

Each element included in embodiments described above can be combined to the extent possible and these combinations are also encompassed within the scope of the embodiments as long as they include the features of the embodiments. Various other variations and modifications can be conceived by those skilled in the art within the spirit of the invention, and it is understood that such variations and modifications are also encompassed within the scope of the embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor device, comprising:

forming a first semiconductor layer;
   forming a second semiconductor layer on the first semiconductor layer, the second semiconductor layer having a band gap narrower than a band gap of the first semiconductor layer and including a region containing an acceptor in a part of the second semiconductor layer in contact with the first semiconductor layer;
   forming a third semiconductor layer on the second semiconductor layer, the third semiconductor layer having a band gap wider than or equal to the band gap of the second semiconductor layer;
   exposing the region containing the acceptor by removing a part of the third semiconductor layer and a part of the second semiconductor layer;
   activating the acceptor in the region; and
   forming a first electrode and a second electrode on the third semiconductor layer, forming a control electrode between the first electrode and the second electrode, and forming a third electrode on the region.

2. The method according to claim 1, wherein the forming the second semiconductor layer includes implanting the acceptor into the region by delta doping.

3. The method according to claim 1, wherein a thickness of the region is 3 nanometers or more and 10 nanometers or less.

4. The method according to claim 1, wherein a concentration of the acceptor in the region is $1 \times 10^{11}$ cm$^{-2}$ or more and $1 \times 10^{14}$ cm$^{-2}$ or less.

* * * * *